(12) United States Patent
Wheat et al.

(10) Patent No.: US 6,731,219 B1
(45) Date of Patent: May 4, 2004

(54) FORCE SENSITIVE SWITCH

(76) Inventors: Norman Victor Wheat, Gate Inn Cottage, Thruscross, N. Yorkshire, HG3 4AH (GB); Jonathan Norman Wheat, 1017 N. Glenwood Ave., Peoria, IL (US) 61606

( * ) Notice: Subject to any disclaimer, the term of this patent is extended or adjusted under 35 U.S.C. 154(b) by 0 days.

(21) Appl. No.: 10/092,338

(22) Filed: Feb. 28, 2002

(51) Int. Cl.[7] ............................................. G08B 21/00
(52) U.S. Cl. ..................... 340/686.2; 340/665; 340/679
(58) Field of Search ........................ 340/686.2, 686.1, 340/665, 540, 661, 679

(56) References Cited

U.S. PATENT DOCUMENTS

| | | | | |
|---|---|---|---|---|
| 2,209,466 A | * | 7/1940 | Miller | 340/679 |
| 4,102,031 A | * | 7/1978 | Reichow et al. | 29/464 |
| 4,144,421 A | * | 3/1979 | Sakai | 200/61.4 |
| 4,417,237 A | * | 11/1983 | Korth | 340/686.2 |
| 4,578,186 A | * | 3/1986 | Morin | 210/90 |
| 5,047,753 A | * | 9/1991 | Birchfield | 340/984 |
| 6,234,032 B1 | * | 5/2001 | Okumoto | 73/862.68 |

* cited by examiner

Primary Examiner—Benjamin C. Lee
(74) Attorney, Agent, or Firm—Katane McManus

(57) ABSTRACT

The force sensing switch comprising a housing and a movable member movable relative to the housing upon having a predetermined force applied thereagainst by an adjacent moving structure when the structure becomes misaligned, the movable member engaging circuitry within the housing which will produce an alarm signal and will stop the adjacent structure from moving.

7 Claims, 1 Drawing Sheet

FORCE SENSITIVE SWITCH

BACKGROUND OF THE INVENTION

1. Field of the Invention

The present invention relates to a force sensitive switch. More particularly, the switch, when force is applied against a section thereof, is operative to stop a machine or the like until a structure of the machine producing the force on the switch, is repositioned.

2. Prior Art

The existing art for such devices uses roller switches or rubbing blocks for force detection. The roller switch, when contacted by a misaligned belt, for example, has a spring loaded arm which rotates about a pivot, when the arm has rotated beyond a predetermined point, the switch gives a signal by closure of contacts or the like. The roller mounted upon the pivoted arm is free to rotate about its own axis so that contact with the moving belt will not cause undue wear.

When a belt is partially misaligned, sufficient to contact the roller but insufficient to cause machine stoppage, the roller rotates continuously, generating heat, and becoming a maintenance hazard.

An alternative type of detector, known generally as a rub block or rubbing block, is made from substantially rigid material containing, embedded therewithin, a temperature detector. When used in the above described application, when the moving belt contacts the rubbing block applying force thereagainst, the rubbing block becomes heated and when the preset temperature is reached, the temperature sensor generates a signal to stop the machine. This type of detector is hazardous as heat must be generated for the device to operate.

SUMMARY OF THE INVENTION

According to the invention there is provided a force sensing switch comprising a housing and a movable member movable relative to the housing upon having a predetermined force applied thereagainst by an adjacent moving structure when the structure becomes misaligned, the movable member engaging circuitry within the housing which will produce an alarm and will stop the adjacent structure from moving.

DESCRIPTION OF THE PREFERRED EMBODIMENTS

Figure 1:
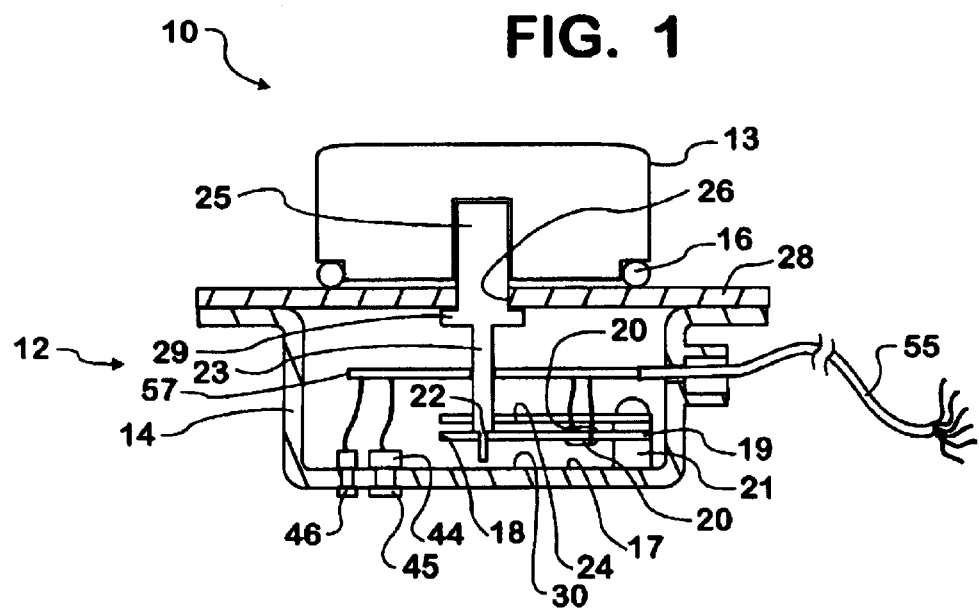
FIG. 1 is a cross sectional view through the switch of the present invention.

Perusing the Figures in greater detail, it will be understood that the force sensitive switch made in accordance with the teachings of the present invention and generally identified by the reference numeral 10, comprises a body 12 made up of a rigid housing 14 made from metal or other substantially rigid material and a movable member 13 which is movable toward and away from the rigid housing 14, with a suitable flexible seal 16 engaged therebetween.

Within the housing 14 is mounted a load cell assembly 17 consisting of a bending beam 18 of elastic material fixed at one end 19 to a support base 21 therefor and upon which are bonded strain gauges 20. Acting on the bending beam 18 is one end 22 of a rod 23 suitably guided by a guide beam 24 to permit force to act on the bending beam 18 in one direction only. The other end 25 of the rod 23 is also suitably guided via a port 26 in a wall 28 of the housing 14 and restrained from movement in directions other than the direction of action on the beam 18. Attached to this end 25 of the rod 23 is the movable member 13 which may comprise a suitable button, plate, disc, arm, or sphere which may be hardened to resist the action of wear. The end 25 of the rod 23 also incorporates a shoulder 29 which will not allow the rod 23 to disconnect from the housing 14, the shoulder 29 being of a greater extent than the port 26.

When a force acts on the member 13, it is transmitted via the rod 23 to the bending beam 18 where strain on the beam 18 is measured by the strain gauges 20. The rod 23 is so dimensioned that when the bending beam 18 has been bent to the design limits, and well before the elastic limit is exceeded, the end 22 of the rod 23 contacts a rigid stop 30 which may be a wall 30 of the housing 14 itself, and prevents further force on the movable member 13 from over-stressing the bending beam 18. An amplifier 32 converts the strain on the bending beam 18 to a voltage, substantially proportional to the force applied to the movable member 13. This voltage may be compared in a voltage comparator 34 with a fixed voltage set on an adjustable potentiometer 44 which fixed voltage may be set through manipulation of a set screw 45 such that when the voltage produced by the strain gauge amplifier 32 exceeds the preset potentiometer voltage 44 setting, an output signal is generated by the comparator 34. This output signal is provided to an output device such as an indicator light 46 and/or a normally energized relay coil 47 to signal that the force acting on the movable member 13 had exceeded the setting on the potentiometer 44, turning off the indicator light 46 and deenergizing the relay coil 47 to cause an alarm indication and/or stoppage of a machine part producing the force on the movable member 13, to be described further below.

When the rigid housing 14 of the switch 10 is mounted solidly to one part of a machine (not shown), misaligned motion of another part of the machine (not shown), adjacent the movable member 13, will cause a force to be applied to the movable member 13. Therefore the switch 10 can be used to detect relative displacement or misalignment between two parts of a machine.

This detection is particularly applicable, but not limited, to machines such as belt conveyors or belt elevators (not shown) where it is necessary to detect that movement of a belt of the machine into an undesirable or misaligned position has occurred. In such application, the switch 10 would be mounted to a rigid part of a machine in such a position that if the moving belt of the machine was misaligned laterally, it would generate a force onto and against the movable member 13 of the switch 10. In such application, the force sensing switch 10 may be arranged to warn of, or control, such an "out of bounds" condition.

Figure 2:
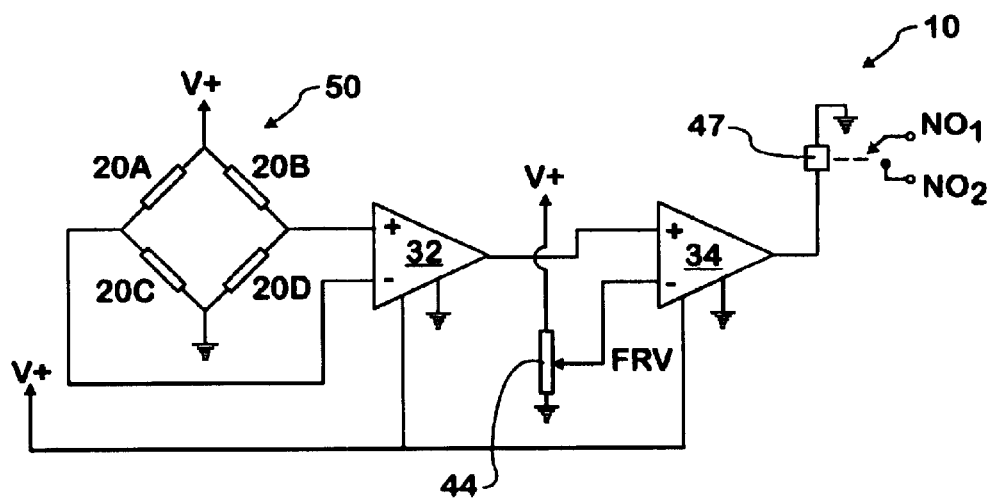
FIG. 2 is a diagram showing switch circuitry.

The heart of the touch switch 10 may be in the form of either a Wheatstone full bridge 50 consisting of resistive-type strain gauges 20A, 20B, 20C and 20D, fed by voltage V+ as shown in FIG. 2 or may be a Wheatstone half bridge 50 consisting of resistive-type strain gauges 20B and 20D and fixed resistors 20A and 20C, as will be understood by those skilled in the art. If no force is applied to movable member 13, no bending of beam 18 occurs and the resistance on all gauges 20A, 20B, 20C and 20D is equal. In this condition, the voltages at the left and right arms of the bridge 50 which feed differential amplifier 32 are equal fractions of V+ and relay coil 47 is maintained in its normally energized state.

When force is applied to movable member 13 it transmits this force downward on rod 23 which in turn causes bending of beam 18 mounting strain gauges 20, when connected as a full bridge, the resistance of 20A and 20D increases and the resistance of 20B and 20C decreases. When connected as a half bridge, the resistance of 20B decreases and the resistance of 20D increases. Either case causes the output voltage of amplifier 32 to increase substantially proportionally with increasing force. If this force increases to the point where the voltage at the output of amplifier 32 and therefore at the A input of comparator 34 exceeds the voltage at the B input of comparator 34, then the output of comparator 34 goes high, deenergizing the output device, shown in this embodiment to comprise the relay coil 47. The signal can produce a visual indication through the preferred LED 46, and can pass through a cable 55, suitably attached to the machine in known manner, to cause motion of the adjacent structure, such as the belt, to cease, upon misalignment.

It will also be understood by those skilled in the art that various structures of the circuitry described above may be mounted on a circuit board 57, if desired.

As described above, the force sensing switch 10 provides a number of advantages, some of which have been described above and others of which are inherent in the invention. Also, modifications may be proposed to the switch 10 without departing from the teachings herein. As an example, all equivalent structures, such as use of a Wheatstone quarter bridge in place of a half or full bridge, etc., should be considered within the scope of the teachings herein. Accordingly, the scope of the invention is only to be limited as necessitated by the accompanying claims.

What is claimed is:

1. A force sensing switch comprising a housing and a movable member movable relative to the housing upon having a predetermined force applied thereagainst by an adjacent moving structure when the structure becomes misaligned, the movable member engaging circuitry within the housing which will produce an alarm signal indicating a need to stop the adjacent structure from moving, the circuitry comprising;

a load cell assembly which includes a bending beam engaged to the movable member with strain gauges thereon and, wherein strain applied on the bending beam as measured by the strain gauges is converted to a voltage by an amplifier, which is compared to preset voltage provided from a settable potentiometer of the switch by a comparator, and wherein a voltage from the amplifier that is greater than the voltage from the settable potentiometer, will produce the alarm signal, and a relay coil of the switch being activated when the voltage from the amplifier is above the voltage from the potentiometer to produce the alarm signal.

2. The switch of claim 1 wherein the movable member comprises a button, a plate, an arm, a disc or a sphere.

3. The switch of claim 1 wherein the movable member is movable toward the housing when force is applied thereagainst.

4. The switch of claim 1 wherein a flexible seal is positioned between the housing and the movable member.

5. The switch of claim 1 wherein the voltage is substantially proportional to the force applied to the movable member.

6. The switch of claim 1 wherein the alarm signal is in the form of a visual indication.

7. The switch of claim 1 wherein the alarm signal is in the form of a visual indication and in the form of an electrical signal which will cause the adjacent moving structure to stop moving.

* * * * *